United States Patent [19]

Higashi et al.

[11] Patent Number: 5,059,511
[45] Date of Patent: Oct. 22, 1991

[54] PRESENSITIZED PLATES FOR USE IN MAKING LITHOGRAPHIC PRINTING PLATES REQUIRING NO DAMPENING WATER

[75] Inventors: Tatsuji Higashi; Yukio Abe; Nobuyuki Kita, all of Shizuoka, Japan

[73] Assignee: Fuji Photo Film Co., Ltd., Minami-ashigara, Japan

[21] Appl. No.: 485,520

[22] Filed: Feb. 27, 1990

[30] Foreign Application Priority Data

Feb. 28, 1989 [JP] Japan ................................. 1-46956

[51] Int. Cl.$^5$ ............................................. G03C 1/76
[52] U.S. Cl. .................................... 430/272; 430/271; 430/281; 430/284; 430/306
[58] Field of Search ............... 430/272, 271, 281, 284, 430/306

[56] References Cited

U.S. PATENT DOCUMENTS

| | | | |
|---|---|---|---|
| 4,755,445 | 7/1988 | Hasegawa | 430/272 |
| 4,826,752 | 5/1989 | Yoshida et al. | 430/272 |
| 4,861,698 | 8/1989 | Hiruma et al. | 430/272 |
| 4,874,686 | 10/1989 | Urabe et al. | 430/272 |

Primary Examiner—Jack P. Brammer
Attorney, Agent, or Firm—Burns, Doane, Swecker & Mathis

[57] ABSTRACT

A presensitized plate, for use in making a lithographic printing plate requiring no dampening water, comprises a substrate, a light-sensitive resin layer applied thereon and a silicone rubber layer formed on the light-sensitive layer which is cross-linked through a reaction of SiH groups with —CH=CH— groups, the light-sensitive resin layer comprising:

(1) a monomer or an oligomer having at least one photopolymerizable (meth)acryloyl group and at least one allyl group;
(2) a photopolymerization initiator; and optionally
(3) a polymeric compound having film-forming ability; and
(4) a monomer or an oligomer having at least one photopolymerizable (meth)acryloyl groups and free of allyl groups.

According to the presensitized plate, the adhesion between the addition type silicone rubber layer and the light-sensitive resin layer is greatly improved and excellent image-forming properties of the presensitized plate are thus ensured.

13 Claims, No Drawings

PRESENSITIZED PLATES FOR USE IN MAKING LITHOGRAPHIC PRINTING PLATES REQUIRING NO DAMPENING WATER

BACKGROUND OF THE INVENTION

The present invention relates to a presensitized plate for use in making a lithographic printing plate which makes it possible to perform printing without using dampening water.

There have been proposed various kinds of presensitized plates for use in making lithographic printing plates requiring no dampening water (hereunder referred to as "water-less PS plates) for performing lithographic printing operations without using any dampening water. Among them, those comprising, on a substrate, a light-sensitive resin layer and a silicone rubber layer in this order show quite excellent properties, as disclosed in, for instance, Japanese Patent Publication for Opposition Purpose (hereinafter referred to as "J.P. KOKOKU") Nos. Sho 54-26923 and Sho 55-22781.

The silicone rubber layer used in these water-less PS plates are in general obtained by partially cross-linking, with a cross-linking agent, a high molecular weight polymer comprising a polysiloxane structure as its principal skeleton. On the other hand, there have been used, as a light-sensitive resin layer, photopolymerizable light-sensitive compositions, photodimerizable light-sensitive compositions or diazo type light-sensitive compositions, which are cured upon exposure in case of positive-working presensitized plates for use in making lithographic printing plates (hereunder referred to as "PS plates"). In general, to form images on these PS plates having the foregoing layer structure, the light-sensitive resin layer is cured by irradiating it with light, if necessary, by causing photoadhesion at the boundary between the light-sensitive layer and the silicone rubber layer provided thereon during the exposure to light, for firmly bonding them and for simultaneously preventing the penetration of a developer into the plate and hence the dissolution of the light-sensitive layer, whereby forming non-image areas comprising the silicone rubber layer. On the other hand, image areas can be formed by permeating the developer into the light-sensitive layer through the silicone rubber layer to dissolve out a part or whole of the uncured light-sensitive layer and then removing the silicone rubber layer on the uncured light-sensitive layer by means of a physical force. It is important to prevent the removal of the non-image areas during the development and subsequent printing operations, by firmly adhering the light-sensitive resin layer to the silicone rubber layer when the images are formed in such a manner. For this reason, various light-sensitive compositions have been proposed. For instance, a photopolymerizable light-sensitive composition disclosed in Japanese Patent Unexamined Publication (hereunder referred to as "J.P. KOKAI") Nos. Sho 63-253949 and Sho 63-280250, in which an allyl methacrylate copolymer is used as a binder, makes it possible to ensure the adhesion between a light-sensitive layer and a silicone rubber layer to some extent if the composition for the silicone rubber layer to be applied onto the layer of the light-sensitive composition is properly selected and thus to be able to form images. However, the quality of the images thus formed is not still sufficient.

SUMMARY OF THE INVENTION

Accordingly, an object of the present invention is to provide a water-less PS plate having an improved adhesion between a light-sensitive layer and a silicone rubber layer and hence being excellent in its image-forming property.

The inventors of this invention have conducted various and intensive studies to achieve the foregoing object and have found out that a water-less PS plate showing an excellent image-forming property can be obtained by incorporating a photopolymerizable monomer having a specific functional group into a light-sensitive resin layer of the water-less PS plate which comprises, on a substrate, the light-sensitive layer and a silicone rubber layer in this order. The present invention has been completed based on this finding.

Namely, the present invention relates to a water-less PS plate which comprises, on a substrate, a light-sensitive resin layer and a silicone rubber layer in this order, said silicone rubber layer being formed by cross-linking through a reaction of an $\equiv$SiH group with a —CH=CH— group, wherein said light-sensitive resin layer comprises:

(1) a monomer or an oligomer having at least one photopolymerizable (meth)acryloyl group and at least one allyl group; and
(2) a photopolymerization initiator.

DETAILED EXPLANATION OF THE INVENTION

The water-less PS plate of the present invention will hereunder be described in more detail.

The water-less PS plate must provide a lithographic printing plate which has a flexibility sufficient for the printing plate to be set on the usual printing press and which can withstand the load applied thereto during printing operations. Therefore, examples of typical substrates for the water-less PS plate include coated paper, a metal plate such as an aluminum plate, a plastic film such as a polyethylene terephthalate film, a rubber plate, and a composite thereof. The surface of the substrate can be coated with a primer layer or the like for preventing the occurrence of halation and for other purposes.

For the preparation of the primer layer, various materials can be employed to improve the adhesion between the substrate and the light-sensitive resin layer, to prevent halation, to dye images and/or to enhance the printing properties of the resulting lithographic printing plate. Examples thereof include those obtained by exposing to light a variety of light-sensitive polymers to cure them prior to the application of the light-sensitive resin layer, as disclosed in J.P. KOKAI No. Sho 60-22903; those obtained by curing by heat epoxy resins, as disclosed in J.P. KOKAI No. Sho 62-50760; and those obtained by hardening gelatin films, as disclosed in J.P. KOKAI No. Sho 63-133151. Besides, the use of a hardened casein film is also effective.

In addition, the primer layer may further comprise a polymer having a glass transition point of not more than room temperature, such as polyurethanes, polyamides, styrene/butadiene rubbers, carboxyl-modified styrene/butadiene rubbers, acrylonitrile/butadiene rubbers, carboxylic acid-modified acrylonitrile/butadiene rubbers, polyisoprenes, acrylate rubbers, polyethylenes, chlorinated polyethylenes and chlorinated polypropylenes.

The amount of these polymers to be added is not critical.

The primer layer may also comprise, depending on the foregoing purposes, additives, for instance, dyes, pH indicators, agents or compositions for obtaining a visible image immediately after imagewise exposure to light, photopolymerization initiators, adhesive improvers (such as polymerizable monomers, diazo resins, silane coupling agents, titanate coupling agents or aluminum coupling agents), white pigments and/or silica powder. The amount of the primer layer to be coated in general ranges from 2 to 20 g/m² (determined after drying).

The light-sensitive resin layer used for obtaining the water-less PS plate of the present invention can be obtained from a light-sensitive composition which comprises (1) a photopolymerizable monomer or an oligomer having at least one (meth)acryloyl group and at least one allyl group; (2) a photopolymerization initiator. The light-sensitive composition may further comprise, as optional components, (3) a polymeric compound having a film-forming ability and (4) a monomer or an oligomer having at least one photopolymerizable (meth)acryloyl group and free of allyl groups.

Each component of the light-sensitive composition will hereunder be explained in more detail.

COMPONENT (1)

Photopolymerizable Monomer or Oligomer Having (Meth)-acryloyl and Allyl Groups Examples of those monomers or oligomers are reaction products of an isocyanate having an allyl group such as allyl isocyanate,

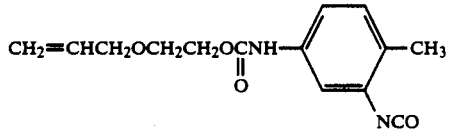

or

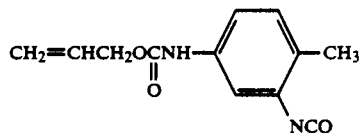

with a (meth)acrylate compound having a hydroxyl group such as hydroxyethyl (meth)acrylate, hydroxypropyl (meth)acrylate, polyethylene glycol mono(meth)acrylate, polypropylene glycol mono(meth)acrylate, pentaerythritol tri(meth)acrylate, dipentaerythritol tetra(meth)acrylate, or a compound represented by the following formula:

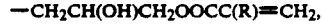

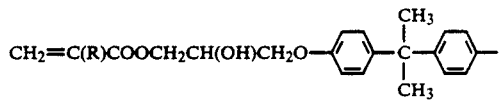

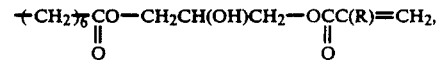

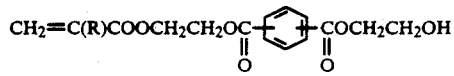

(wherein R represents a hydrogen atom or a methyl group); reaction products of a glycidyl ether having an allyl group such as allyl glycidyl ether with a (meth)acrylate having a carboxyl group such as (meth)acrylic acid, (meth)acryloxyethyl hydrogen phthalate, (meth)acryloxyethyl hydrogen succinate, (meth)acryloxyethyl hydrogen maleate, (meth)acryloxyethyl hydrogen tetrahydrophthalate and (meth) acryloxyethyl hydrogen hexahydrophthalate; reaction products of an alcohol having an allyl group such as allyl alcohol or 2-allyloxyethyl alcohol with the foregoing (meth)acrylate having a carboxyl group or its acid chloride.

The amount of the photopolymerizable monomer or oligomer preferably ranges from 5 to 65% by weight, more preferably 10 to 45% by weight on the basis on the total solid weight of the light-sensitive resin layer.

COMPONENT (2)

Photopolymeriation Initiators

Examples of the photopolymerization initiators usable in the present invention are vicinal polyketaldonyl compounds disclosed in U.S. Pat. No. 2,367,660; α-carbonyl compounds disclosed in U.S. Pat. Nos. 2,367,661 and 2,367,670; acyloin ethers disclosed in U.S. Pat. No. 2,448,828; aromatic acyloin compounds which are substituted with an α-hydrocarbon group disclosed in U.S. Pat. No. 2,722,512; polynuclear quinone compounds disclosed in U.S. Pat. Nos. 3,046,127 and 2,951,758; combinations of triaryl imidazole dimers with p-aminophenyl ketone disclosed in U.S. Pat. No. 3,549,367; benzothiazole type compounds disclosed in U.S. Pat. No. 3,870,524; benzothiazole type compounds/trihalomethyl-s-triazine type compounds disclosed in U.S. Pat. No. 4,239,850; and acridine and phenazine compounds disclosed in U.S. Pat. No. 3,751,259; as well as oxadiazole compounds disclosed in U.S. Pat. No. 4,212,970; trihalomethyl-s-triazine type compounds having chromophoric groups disclosed in U.S. Pat. Nos. 3,954,475 and 4,189,323; J.P. KOKAI Nos. Sho 53-133428, Sho 60-105667 and Sho 62-58241 and Japanese Patent Application Serial (hereunder referred to as "J.P.A.") No. Sho 61-227489; and peroxy ester compounds containing benzophenone groups disclosed in J.P. KOKAI Nos. Sho 59-197401 and 60-76503.

The amount of the photopolymerization initiator preferably ranges from 0.1 to 20% by weight, and more preferably 1 to 10% by weight on the basis of the total solid weight of the light-sensitive resin layer.

COMPONENT (3)

Polymeric Compounds Having Film-Forming Ability

Examples of these polymeric compounds include methacrylic acid copolymers, acrylic acid copolymers, crotonic acid copolymers, maleic acid copolymers, partially esterified maleic acid copolymers, acidic cellulose derivatives, polyvinyl pyrrolidone, polyethylene oxides, alcohol-soluble nylons, polyesters, unsaturated polyesters, polyurethanes, polystyrenes, epoxy resins, phenoxy resins, polyvinyl butyral, polyvinyl formal, polyvinyl chloride, polyvinyl alcohol, polyvinyl alcohol partially modified with acetal, water-soluble nylons, water-soluble urethanes, gelatin and water-soluble cellulose derivatives.

In addition, such polymeric compounds having a film-forming ability include those having a group containing photopolymerizable or photo-crosslinkable olefinic unsaturated double bonds on their side chains. Examples of such polymeric compounds include copolymers of allyl (meth)acrylate/(meth)acrylic acid-/optional other addition polymerizable vinyl monomer and their alkali metal salts or amine salts as disclosed in J.P. KOKAI No. Sho 59-53836; those obtained by reacting hydroxyethyl (meth)acrylate/(meth)acrylic acid/alkyl (meth) acrylate copolymers and their alkali metal salts or amine salts with a (meth)acrylic acid chloride, as disclosed in J.P. KOKOKU No. 59-45979; those obtained by adding pentaerythritol triacrylate to maleic anhydride copolymers through half-esterification and their alkali metal salts or amine salts, as disclosed in J.P. KOKAI No. Sho 59-71048; those obtained by adding a monohydroxyalkyl (meth)acrylate, polyethylene glycol mono(meth)acrylate or polypropylene glycol mono(meth)acrylate to a styrene/maleic anhydride copolymer through half-esterification, as well as their alkali metal salts or amine salts; those obtained by reacting a part of the carboxyl groups of (meth)acrylic acid copolymers or crotonic acid copolymers with a glycidyl (meth)acrylate and their alkali metal salts or amine salts; those obtained by reacting hydroxyalkyl (meth)acrylate copolymers, polyvinyl formal or polyvinyl butyral with maleic anhydride or itaconic anhydride as well as their alkali metal salts or amine salts; those obtained by reacting hydroxyalkyl (meth)acrylate/(meth) acrylic acid copolymers with a 1:1 adduct of 2,4-tolylene diisocyanate and hydroxyacryl (meth)acrylate, as well as their alkali metal salts or amine salts; (meth)acrylic acid copolymers partially reacted with allyl glycidyl ether, as well as their alkali metal salts or amine salts, as disclosed in J.P. KOKAI No. Sho 59-53836; vinyl (meth)acrylate/(meth)acrylic acid copylmers and their alkali metal salts or amine salts; allyl (meth)acrylate/sodium styrene sulfonate copolymers; vinyl (meth)acrylate/sodium styrene sulfonate copolymers; allyl (meth)acrylate/sodium acrylamindo-1,1-dimethylethylene sulfonate copolymers; vinyl (meth)acrylate/sodium acrylamido-1,1-dimethylethylene sulfonate copolymers; 2-allyloxyethyl (meth)acrylate/(meth)acrylic acid copolymers; and 2-allyloxyethyl (meth)acrylate/2-(meth)acryloxyethyl hydrogen succinate copolymers.

The amount of the polymeric compound to be added in general ranges from 30 to 94% by weight, and preferably 50 to 90% by weight on the basis of the total solid weight of the light-sensitive resin layer.

COMPONENT (4)

Monomers or Oligomers Having (Meth)acryloyl Groups and Free of Allyl Groups

Examples of these monomers or oligomers having at least one photopolymerizable (meth)acrylate group free of allyl groups which are optionally used, include monofunctional acrylates or methacrylates such as polyethylene glycol mono(meth)acrylates, polypropylene glycol mono(meth)acrylates, phenoxyethyl (meth)acrylates, 2-(meth) acryloxyethyl hydrogen phthalates and 2-(meth)acryloxyethyl hydrogen succinates; polyfunctional acrylates or methacrylates such as polyethylene glycol di(meth)acrylates, trimethylolethane tri(meth) acrylates, neopentyl glycol di(meth)acrylates, pentaerythritol tri(meth)acrylates, pentaerythritol tetra(meth)acrylates, dipentaerythritol hexa(meth)acrylates, hexanediol di(meth)acrylates, trimethylolpropane tri(acryloyloxypropyl) ether, tri(acryloyloxyethyl) isocyanurate, calcium (meth)acrylates, sodium (meth)acrylates; those obtained by adding ethylene oxide or propylene oxide to a polyhydric alcohol such as glycerin or trimethylolethane and then reacting the product with (meth)acrylate; urethane acrylates disclosed in J.P. KOKOKU Nos. Sho 48-41708 and Sho 50-6034 and J.P. KOKAI No. Sho 51-37193, polyester acrylates disclosed in J.P. KOKAI No. Sho 48-64183 and J.P. KOKOKU Nos. Sho 49-43191 and Sho 52-30490 and epoxy acrylates obtained by reacting epoxy resins with (meth)acrylic acid; and N-methylol acrylamide derivatives disclosed in U.S. Pat. No. 4,540,649. In addition, it is also possible to use photohardenable monomers or oligomers described in Bulletin of Japan Adhesives Society, Vol. 20, No. 7, pp. 300-308.

The total amount of Component (1) and Component (4) in general ranges from 6 to 70% by weight and preferably 10 to 50% by weight on the basis of the total solid weight of the light-sensitive resin layer.

OTHER COMPONENTS

In addition to the foregoing components, the light-sensitive composition preferably comprises a heat polymerization inhibitor. Examples of useful heat polymerization inhibitors are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole.

Further, the light-sensitive composition may optionally comprise dyes or pigments for coloring the light-sensitive resin layer and/or pH indicators or leuco dyes as agents or compositions for obtaining a visible image immediately after imagewise exposure.

The light-sensitive composition may further comprise a small amount of a silicone compound such as polydimethyl siloxane, methylstyrene-modified polydimethyl siloxane, olefin-modified polydimethyl siloxane, polyether-modified polydimethyl siloxane, silane coupling agents, silicone diacrylate or silicone dimethacrylate, depending on purposes.

In order to improve the coating properties of the light-sensitive composition, a fluorine-containing surfactant or a fluorine-containing agent for surface-orientation can be incorporated into the light-sensitive composition.

Moreover, a diazo resin may be added to the light-sensitive composition for improving the adhesion between the light-sensitive resin layer and the primer layer.

The amount of these additives to be added to the light-sensitive composition is in general not more than 10% by weight based on the total weight of the composition.

It is also possible to add, to the light-sensitive composition, silica powder or hydrophobic silica powder whose surface is treated with a (meth)acryloyl group- and/or allyl group-containing silane coupling agent in an amount of not more than 50% by weight of the composition in order to improve the adhesion between the light-sensitive resin layer and the silicone rubber layer provided thereon.

The resultant light-sensitive composition is first dissolved in an appropriate solvent such as 2-methoxyethanol, 2-methoxyethyl acetate, methyl lactate, ethyl lactate, propylene glycol monomethyl ether, methanol, ethanol, methyl ethyl ketone and water which may be used alone or in combination; then applied onto the surface of a substrate. The amount (expressed in the weight determined after drying) of the light-sensitive composition to be applied onto the substrate suitably ranges from about 0.1 to 10 g/m$^2$ and preferably 0.5 to 5 g/m$^2$.

The silicone rubber layer which has been crosslinked through addition reaction between an ≡SiH group and a —CH=CH— group and is used in the present invention can be obtained by reacting a polyvalent hydrogen organopolysiloxane with a polysiloxane having at least two —CH=CH— bonds in a molecule. This layer is desirably obtained by curing a composition comprising the following components, to cause crosslinking.

(a) 100 parts by weight of an organopolysiloxane having at least two alkenyl groups (desirably vinyl groups) which are directly bonded to silicon atoms in a molecule;
(b) 0.1 to 1,000 parts by weight of an organohydrogen polysiloxane having at least two ≡SiH bonds in the molecule; and
(c) 0.00001 to 10 parts by weight of a catalyst for the addition reaction.

The alkenyl groups of Component (a) may be present either at the ends or in the middle of the molecular chain. The organopolysiloxane may have other organic groups such as substituted or unsubstituted alkyl and/or aryl groups in addition to the alkenyl groups. Component (a) may have a small number of hydroxyl groups in a molecule.

Component (b) reacts with Component (a) to provide a silicone rubber layer and also serves to impart adhesion to the light-sensitive layer to the resulting silicone rubber layer. The hydrogen atom of Component (b) may be present either at the end or in the middle of the molecular chain. Component (b) may have organic groups other than the hydrogen atom, such as those selected from the groups listed above in connection with Component (a). It is preferable that at least 60% of the total number of the organic groups of Components (a) and (b) are methyl groups, whereby the ink-repellency of the resulting silicone rubber layer is greatly improved. Components (a) and (b) may be of a linear, cyclic or branched molecular structure. The molecular weight of at least one of them preferably exceeds 1,000 to thus provide the silicone rubber layer with excellent physical properties, and more preferably thxt of Component (a) exceeds 1,000.

Specific examples of Component (a) are α, ω-divinyl polydimethylsiloxane and methylvinyl siloxane/-dimethyl siloxane copolymer which has methyl groups at its both ends. Specific examples of Component (b) are polydimethyl siloxane having hydrogen atoms at its both ends, α, ω-dimethyl polymethyl hydrogen siloxane, methyl hydrogen siloxane/dimethyl siloxane copolymer which has methyl groups at its both ends and cyclic polymethyl hydrogen siloxane.

The catalyst for the addition reaction, Component (c), may be selected from any conventional ones. It is preferably platinum type compounds. Examples of such platinum compounds are metal platinum, platinum chloride, chloroplatinic acid and platinum coordinated with olefins.

The composition for obtaining silicone rubber layer may further comprise a crosslinking inhibitor such as a vinyl group-containing organopolysiloxane, for instance, tetracyclo(methylvinyl)siloxane, a C—C triple bond-containing alcohol, acetone, methyl ethyl ketone, methanol, ethanol and propylene glycol monomethyl ether, for the puxpose of controlling the curing rate of the composition.

The addition reaction takes place and curing is initiated as soon as these three components are mixed together. The curing rate rapidly increases as the reaction temperature is elevated. Therefore, the composition is preferably maintained at a temperature at which the properties of the substrate and the light-sensitive resin layer do not change, for the purpose of extending the pot life of the composition and of shortening the time required for curing the composition on the light-sensitive resin layer. This can further provide highly stable adhesion of the resulting silicone rubber layer to the light-sensitive resin layer.

If necessary, the composition may further comprise, in addition to the foregoing components, known agents for imparting adhesive properties to the rubber layer such as alkenyl trialkoxysilanes; hydroxyl group-containing organopolysiloxanes which are components of condensation type silicone rubber layers; and/or hydrolyzable functional group-containing silanes (or siloxanes). The composition may also comprise known fillers such as silica for enhancing the strength of the resulting rubber layer.

After plate-making processes, the silicone rubber layer of the water-less PS plate of the present invention serves as an ink repellent layer. Therefore, if the thickness thereof is too small, the ink repellency thereof becomes low and the layer is liable to be injured, while if it is too great, the developability of the resulting water-less PS plate is impaired. Thus, the thickness of the silicone rubber layer preferably ranges from 0.5 to 5 μm.

The addition type silicone rubber layer to be used in the present invention is relatively independent of humidity during curing, further fast cross-linking can be achieved and hence the desired physical properties of the silicone rubber layer can easily be obtained. The condensation type silicone rubber layer is insufficiently cured depending on the kinds of the cross-linking agents to be used, if carboxyl groups are present in the light-sensitive resin layer. On the contrary, the addition type one can be sufficiently cured even if carboxyl groups are present. Namely, the curing of the silicone rubber layer of the latter type is almost independent of the presence of the carboxyl groups in the light-sensitive resin layer and the resulting PS plates can be treated with a developer mainly comprising water or alkaline water. Therefore, the desired water-less PS plates can easily be designed.

The water-less PS plates may further comprise a variety of silicone rubber layers on the foregoing silicone rubber layer. Moreover, it is also possible to provide an adhesive bond between the light-sensitive resin layer and the silicone rubber layer for the purposes of enhancing the adhesive force therebetween and of suppressing the poisonous effect of catalysts present in the silicone rubber layer.

In addition, a coating composed of a transparent film formed from, for instance, polyethylene, polypropylene, polyvinyl chloride, plyvinylidene chloride, polyvinyl alcohol, polyethylene terephthalate and cellophane can optionally be applied onto the surface of the silicone rubber layer or such a film may be laminated with the silicone rubber layer, in order to protect the surface of the layer.

The water-less PS plate of the present invention is exposed to light through a transparent original and then is developed with a developer capable of dissolving out or swelling a part or whole of the light-sensitive resin layer on the image areas (or non-exposed areas) or a developer capable of swelling the silicone rubber layer. In this case, the development is performed so that both the light-sensitive resin layer and silicone rubber layer concerning the image areas are removed or only the silicone rubber layer concerning the image areas is removed, depending on the strength of the developer.

As a developer usable in the present invention, any known ones for developing conventional water-less PS plates can be employed. Preferred examples thereof are aliphatic hydrocarbons such as hexane, heptane, "Isopars E, H and G" (trade names of aliphatic hydrocarbons available from ESSO CHEMICALS INC.), gasoline and kerosine; aromatic hydrocarbons such as toluene and xylene; or halogenated hydrocarbons such as trichlene, to which the following polar solvent is added; or a polar solvent per se.

(i) Alcohols such as methanol, ethanol, propanol, benzyl alcohol, ethylene glycol monophenyl ether, 2-methoxyethanol, 2-ethoxyethanol, carbitol monoethyl ether, carbitol monomethyl ether, triethylene glycol monoethyl ether, propylene glycol monomethyl ether, propylene glycol monoethyl ether, dipropylene glycol monomethyl ether, polyethylene glycol monomethyl ether, propylene glycol, polypropylene glycol, triethylene glycol and tetraethylene glycol.

(ii) Ketones such as acetone and methyl ethyl ketone.

(iii) Esters such as ethyl acetate, methyl lactate, ethyl lactate, butyl lactate, propylene glycol monomethyl ether acetate, carbitol acetate, dimethyl phthalate and diethyl phthalate.

(iv) Other polar solvents such as triethyl phosphate and tricresyl phosphate.

It is also possible to use developers obtained by adding water to the foregoing organic solvent type developers and those obtained by solubilizing the foregoing organic solvents in water by means of a surfactant or the like, to which an alkaline agent (such as sodium carbonate, monoethanolamine, diethanolamine, triethanolamine, sodium silicate, potassium silicate, sodium hydroxide, potassium hydroxide and sodium borate) may be added; as well as tap water per se or an alkaline water per se.

These developers may comprise a dye such as Crystal Violet or Astrazone Red for the simultaneous coloration of the image areas with the development.

The development of the water-less PS plate of the present invention can be performed in any known manner, for instance, by rubbing the surface of the plate with a developing pad containing a developer or by pouring a developer onto the surface of the plate and then rubbing the plate surface with a developing brush in water. Thus, the portions of the silicone rubber layer and the light-sensitive resin layer which form images are removed and, as a result, the surface of the substrate or the primer layer is exposed, the exposed portions serving as ink receiving parts. Alternatively, only the portions of the silicone rubber layer which form images can be removed by the foregoing development prosessing. In this case, the surface of the light-sensitive layer is exposed and hence the exposed portions likewise serve as the ink receiving parts.

The water-less PS plate of the present invention comprises, on a substrate, a light-sensitive resin layer and an addition type silicone rubber layer in this order and the light-sensitive resin layer comprises a monomer or an oligomer having at least one (meth) acryloyl group and at least one allyl group; and a photopolymerization initiator; as well as a polymeric compound having film-forming ability and a monomer or an oligomer having at least one photopolymerizable (meth)acryloyl group and free of allyl groups as optional components. Therefore, the adhesion between the addition type silicone rubber layer and the light-sensitive resin layer is improved and excellent image-forming properties of the PS plate are ensured.

The present invention will hereunder be explained with reference to the following non-limitative working Examples in more detail. Moreover, the effects practically achieved by the present invention will also be discussed in comparison with Comparative Examples.

EXAMPLES 1

To the surface of a smooth 1S aluminum plate having a thickness of 0.3 mm which had been degreased in the usual manner, the following composition for a primer layer was applied so that the amount thereof coated was 10 g/m$^2$ (weighted after drying) and then heated at 120° C. for 2 minutes to dry and cure the coated film.

| Component | Amount (part by weight) |
|---|---|
| Milk casein | 48 |
| 40% Aqueous solution of glyoxal | 5 |
| Styrene/butadiene rubber latex (solid content = 50%; Tg of the resulting film = −20° C.) | 100 |
| Na$_2$CO$_3$ | 2.6 |
| TiO$_2$ | 1 |

-continued

| Component | Amount (part by weight) |
|---|---|
| CH₂—CHCH₂OC₃H₆Si(OCH₃)₃ (epoxide) (Adhesion improver to the substrate) | 3 |
| 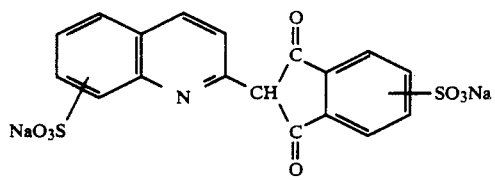 (Yellow dye) | 1.2 |
| CH₂COOC₆H₁₁ \| NaO₃S—CHCOOC₆H₁₁ (surfactant) | 0.5 |
| Pure water | 700 |

The light-sensitive composition having the following composition was applied onto the surface of the aluminum plate to which the primer layer had been applied, so that the amount of the composition coated was 3 g/m² (weighed after drying) and then dried at 100° C. for one minute.

| Component | Amount (part by weight) |
|---|---|
| 2-Allyloxyethyl methacrylate/2-methacryloxy hydrogen succinate (90/10 mole %) copolymer | 2 |
| Compound obtained by adding one mole of CH₂=CHCH₂NCO to (CH₂=CHCOCH₂CHCH₂OCH₂)₇CHOH with O and OH | 0.3 |
| 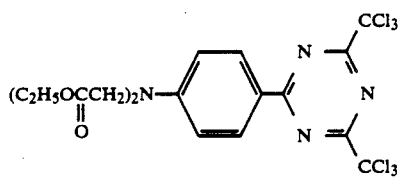 | 0.2 |
| Bromophenol Blue (pH indicator) | 0.01 |
| Defenser MCF 323 (available from DAINIPPON INK AND CHEMICALS, INC.) | 0.02 |
| PF₆ salt of p-diazophenylamine/formaldehyde condensate | 0.002 |
| Propylene glycol monomethyl ether | 15 |
| Methyl ethyl ketone | 10 |

Then, the composition for silicone rubber layers having the following composition was applied onto the light-sensitive resin layer thus formed so that the amount thereof coated was 2.0 g/m² (weighewd after drying) and then dried at 140° C. for 2 minutes to thus obtain a cured silicone rubber layer.

| Component | Amount (part by weight) |
|---|---|
| α,ω-Divinyl polydimethyl siloxane (degree of polymerization = about 700) | 9 |
| 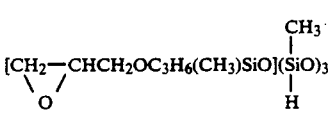 | 1 |
| [CH₂—CHCH₂OC₃H₆(CH₃)SiO](SiO)₃ with CH₃ and H | 0.2 |
| Polydimethyl siloxane (degree of polymerization = about 8,000) | 0.5 |
| Olefin-chloroplatinic acid | 0.2 |
| Inhibitor | 0.15 |
| Isopar G (available from ESSO CHEMICAL INC.) | 160 |

The Silicone rubber layer thus formed was laminated with a single-side-matted polypropylene film having a thickness of 9 μm to obtain a water-less PS plate.

A positive film was placed on the PS plate, brought into contact with the latter in vacuo, exposed to light for 30 counts through the use of an FT26V UDNS ULTRA-PLUS FLIP-TOP PLATE MAKER (available from Nu Arc CO., LTD.) and then the laminate film was removed. The plate thus treated was immersed, for one minute, in a developer which comprised 12 parts by weight of benzyl alcohol, 5 parts by weight of sodium isopropylnaphthalene sulfonate, one part by weight of triethanolamine and 82 parts by weight of water, and then rubbed with a developing pad to remove the light-sensitive resin layer and the silicone rubber layer of the non-image portions. Thus, a lithographic printing plate requiring no dampening water was obtained, the images of the positive film being faithfully reproduced on the whole surface of the lithographic printing plate.

EXAMPLE 2

The light-sensitive composition having the following composition was applied onto the surface of an aluminum substrate having a primer layer as used in Example 1 thereon, and then dried at 100° C. for one minute. The coating amount was 3.0 g/m² (determined after drying).

| Component | Amount (part by weight) |
|---|---|
| Allyl methacrylate/tetraethylene glycol mono-methacrylate/2-methacryloxyethyl hydrogen succinate (60/30/10 molar ratio) copolymer | 2 |
| Product obtained by reacting one mole of xylylene diamine with two moles each of glycidyl methacrylate and glycidyl allyl ether | 0.6 |
| 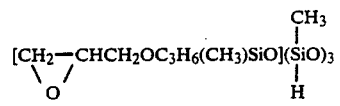 | 0.2 |
| Victoria Pure Blue BOH | 0.01 |
| Defenser MCF 323 (available from DAINIPPON INK AND CHEMICALS, INC.) | |
| Propylene glycol monomethyl ether | 15 |
| Methyl ethyl ketone | 10 |

Subsequently, the following composition for a silicone rubber layer was applied onto the light-sensitive resin layer so that the amount thereof was 2.0 g/m² (determined after drying), and then dried at 140° C. for two minutes to thus obtain a cured silicone rubber layer.

| Component | Amount (part by weight) |
|---|---|
| Dimethyl polysiloxane having trivinyl groups at both ends thereof (degree of polymerization = about 1,300) | 9 |
| $CH_3-Si(-O+SiO)_{30}(SiO)_{10}-Si-CH_3$ with CH₃ groups and H | 1 |
| $[CH_2-CHCH_2OC_3H_6(CH_3)SiO](SiO)_3$ with CH₃ and H | 0.6 |
| CH₃Si(OCOCH₃)₃ | 0.2 |
| Olefin-chloroplatinic acid | 0.2 |
| Inhibitor | 0.15 |
| Isopar G (available from ESSO CHEMICAL CO., LTD.) | 160 |

The silicone rubber layer thus obtained was laminated with a single-side-matted polypropylene film having a thickness of 9 μm to thus obtain a water-less PS plate.

The water-less PS plate was exposed to light and then developed as in Example 1 to obtain a lithographic printing plate requiring no dampening water, with images faithfully reproduced. This result shows that the PS plate was excellent in its image-forming properties.

EXAMPLES 3

The light-sensitive composition having the following composition was applied onto the surface of an aluminum substrate having a primer layer as used in Example 1 thereon so that the coating amount was 3.0 g/m² (determined after drying), and then dried at 100° C. for one minute.

| Component | Amount (part by weight) |
|---|---|
| Polyurethane resin composed of polyester polyol consisting of adipic acid, 1,6-hexanediol and neopentyl glycol and isophorone diisocyanate | 2 |
| Product obtained by reacting one mole of xylylene diamine with two moles each of glycidyl methacrylate and glycidyl allyl ether | 0.6 |
| $CH_2=CHCOO-(CH_2CH_2O)_{12}-COCH=CH_2$ | 0.3 |
| Fluorine atom-containing nonionic surfactant | 0.01 |
| 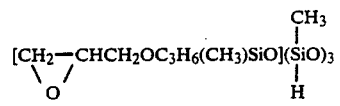 | 0.2 |
| Dodecylbenzene sulfonic acid salt of p-diazophenylamine/formaldehyde condensate | 0.002 |
| Propylene glycol monomethyl ether | 15 |
| Methyl ethyl ketone | 10 |

The composition for a silicone rubber layer used in Example 2, from which the compound represented by the following formula:

$$[CH_2-CHCH_2OC_3H_6(CH_3)SiO](SiO)_3 \text{ with } CH_3 \text{ and } H$$

had been removed, was applied onto the light-sensitive resin layer thus formed so that the coating amount was 2 g/m² (determined after drying) and then dried at 140° C. for 2 minutes, to obtain a cured silicone rubber layer.

The silicone rubber layer thus obtained was laminated with a single-side-matted polyethylene terephthalate film having a thickness of 6.5 μm to thus obtain a water-less PS plate.

The PS plate was exposed to light for 10 counts utilizing the same vacuum plate maker as used in Example 1, thereafter the laminate film was peeled off, the plate was immersed in triethylene glycol maintained at 30° C. for one minute and then the surface of the plate was rubbed with a developing pad in water to remove the silicone rubber layer on the non-exposed portions. Thus, a lithographic printing plate requiring no dampening water was obtained, with the images of the positive film being faithfully reproduced on the whole surface of the lithographic printing plate.

What is claimed is:

1. A presenitized plate for use in making a lithographic printing plate requiring no dampening water which comprises, on a substrate, a light-sensitive resin layer and a silicone rubber layer in this order,
    wherein said silicone rubber is crosslinked through a reaction of a ≡SiH group with a —CH=CH— group and is obtained by curing a composition consisting essentially of the following components, to cause crosslinking;
    .(a) 100 parts by weight of an organopolysiloxane having at least two alkenyl groups which are directly bonded to silicon atoms in a molecule, (b) 0.1 to 1,000 parts by weight of an organohydrogen polysiloxane having at least two ≡SiH bonds in a molecule, and (c) 0.00001 to 10 parts by weight of a catalyst for an addition reaction, wherein said silicone rubber layer is formed directly on said light-sensitive resin layer, and said light-sensitive resin layer comprises in admixture:

(1) 5 to 65% by weight, on the basis of the total solid weight of the light-sensitive resin layer, of a monomer or an oligomer having at least one photopolymerizable (meth)acryloyl group and at least one allyl group, and being selected from the group consisting of: a reaction product of an isocyanate having an allyl group with a (meth)acrylate having a hydroxyl group; a reaction product of a glycidyl ether having an allyl group with a (meth)acrylate having a carboxyl group; and a reaction product of an alcohol having an allyl group with a (meth)acrylate having a carboxyl group or its acid chloride group;

(2) 0.1 to 20% by weight, on the basis of the total solid weight of the light-sensitive resin layer, of a photopolymerization initiator; and (3) 30 to 94% by weight, on the basis of the total solid weight of the light-sensitive resin layer, of a polymeric compound having a film-forming ability.

2. The presensitized plate of claim 1 wherein said isocyanate having an allyl group is selected from allyl isocyanate,

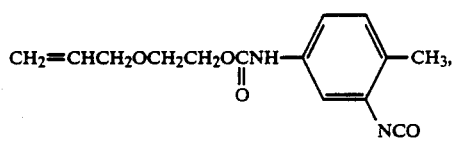

or

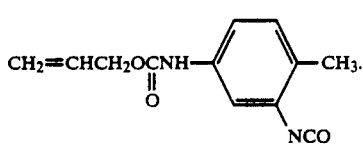

3. The presensitized plate of claim 1 wherein said (meth)acrylate having a hydroxy group is selected from the group consisting of hydroxyethyl (meth)acrylate, hydroxypropyl (meth)acrylate, polyethylene glycol mono(meth)acrylate, polypropylene glycol mono(meth)acrylate, pentaerythritol tri(meth)acrylate, dipentaerythritol tetra(meth)acrylate and compounds represented by the following formulae:

O—CH$_2$CH(OH)CH$_2$OOCC(R)=CH$_2$,

—CH$_2$CH(OH)CH$_2$OOCC(R)=CH$_2$,

—OCH$_2$CH(OH)CH$_2$OOCC(R)=CH$_2$,

-continued

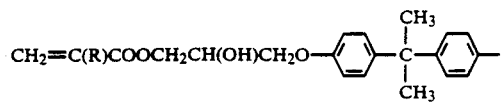

OCH$_2$CH(OH)CH$_2$OOCC(R)=CH$_2$,

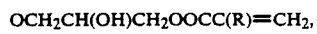

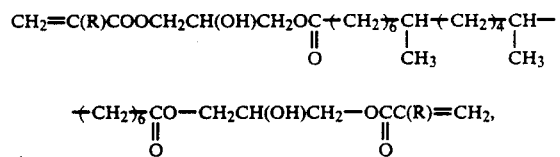

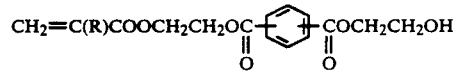

wherein R is a hydrogen atom or a methyl group.

4. The presensitized plate of claim 1 wherein said glycidyl ether having an allyl group is allyl glycidyl ether.

5. The presensitized plate of claim 1 wherein said (meth)acrylate having a carboxyl group is selected from the group consisting of (meth)acrylic acid, (meth)acryloxyethyl hydrogen phthalate, (meth) acryloxyethyl hydrogen succinate, (meth)acryloxyethyl hydrogen maleate, (meth)acryloxyethyl hydrogen tetrahydrophthalate and (meth) acryloxyethyl hydrogen hexahydrophthalate.

6. The presensitized plate of claim 1 wherein said alcohol having an allyl group is allyl alcohol or 2-allyloxyethyl alcohol.

7. The presensitized plate of claim 1 wherein the amount of said monomer or oligomer ranges from 10 to 45% by weight on the basis of the total solid weight of the light-sensitive resin layer.

8. The presensitized plate of claim 1 wherein the photopolymerization initiator is selected from the group consisting of vicinal polyketaldonyl compounds; α-carbonyl compounds; acyloin ethers; aromatic acyloin compounds substituted with an α-hydrocarbon group; polynuclear quinone compounds; combinations of triaryl imidazole dimers with p-aminophenyl ketones; benzothiazole compounds; combinations of benzothiazole compounds and trihalomethyl-s-triazine compounds; acridines; phenazines; oxadiazoles; trihalomethyl-s-triazine compounds having chromophoric groups; and peroxy ester compounds containing a benzophenone group.

9. The presensitized plate of claim 1 wherein the amount of the photopolymerization initiator ranges from 1 to 10% by weight on the basis of the total solid weight of the light-sensitive resin layer.

10. The presensitized plate of claim 1 wherein said polymeric compound is selected from the group consisting of methacrylic acid copolymers, acrylic acid copolymers, crotonic acid copolymers, maleic acid copolymers, partially esterified maleic acid copolymers, acidic cellulose derivatives, polyvinyl pyrrolidone, polyethylene oxide, alcohol-soluble nylons, polyester, unsaturated polyesters, polyurethane, polystyrene, epoxy resins, phenoxy resins, polyvinyl butyral, polyvinyl formal, polyvinyl chloride, polyvinyl alcohol, polyvinyl alcohols partially modified with acetal, water-soluble nylons, water-soluble urethanes, gelatin, water-soluble cellulose derivatives, copolymers of allyl (meth)acrylate/(meth)acrylic acid/optional other addition polymerizable vinyl monomers and their alkali metal salts or amine salts; reaction products of hydroxyethyl (meth)acrylate/(meth)acrylic acid/alkyl (meth)acrylate copolymers and their alkali metal salts or amine salts with a (meth)acrylic acid chloride; polymeric compounds obtained by adding pentaerythritol triacrylate to maleic anhydride copolymers through half-esterification and their alkali metal salts or amine salts; polymeric compounds obtained by adding monohydroxyalkyl (meth)acrylate, polyethylene glycol mono(meth)acrylate or polypropylene glycol mono(meth)acrylate to a styrene/maleic anhydride copolymer through half-esterification and their alkali metal salts or amine salts; polymeric compounds obtained by reacting a part of carboxyl groups of (meth)acrylic acid copolymers or crotonic acid copolymers with glycidyl (meth)acrylate and their alkali metal salts or amine salts; polymeric compounds obtained by reacting hydroxyalkyl (meth)acrylate copolymers, polyvinyl formal or polyvinyl butyral with maleic anhydride or itaconic anhydride and their alkali metal salts or amine salts; polymeric compounds obtained by reacting hydroxyalkyl (meth) acrylate/(meth)acrylic acid copolymers with a 1:1 adduct of 2,4-tolylene diisocyanate and hydroxyacryl (meth)acrylate and their alklai metal salts or amine salts; (meth)acrylic acid copolymers partially reacted with allyl glycidyl ether and their alkali metal salts or amine salts; vinyl (meth)acrylate/(meth)acrylic acid copolymers and their alkali metal salts or amine salts; allyl (meth) acrylate/sodium styrene sulfonate copolymers; vinyl (meth) acrylate/sodium styrene sulfonate copolymers; allyl (meth) acrylate/sodium acrylamido-1,1-dimethylethylene sulfonate copolymers; vinyl (meth)acrylate/sodium acrylamido-1,1-dimethylethylene sulfonate copolymers; 2-allyloxyethyl (meth)acrylate/(meth)acrylic acid copolymers; and 2-allyloxyethyl (meth)acrylate/2-(meth)acryloxyethyl hydrogen succinate copolymers.

11. The presensitized plate of claim 1 wherein said light-sensitive layer further comprises a monomer or oligomer having at least one photopolymerizable (meth)acrylate group and free of allyl groups.

12. The presensitized plate of claim 11 wherein said monomer or oligomer having at least one photopolymerizable (meth)acryloyl group and free of allyl groups is selected from the group consisting of monofunctional acrylates or methacrylates selected from polyethylene glycol mono(meth)acrylates, polypropylene glycol mono(meth)acrylates, phenoxyethyl (meth)acrylates, 2-(meth)acryloxyethyl hydrogen phthalates and 2-(meth)acryloxyethyl hydrogen succinates; polyfunctional acrylates or methacrylates selected from polyethylene glycol di(meth)acrylates, trimethylolethane tri(meth)acrylates, neopentyl glycol di(meth)acrylates, pentaerythritol tri(meth)acrylates, pentaerythritol tetra(meth)acrylates, dipentaerythritol hexa(meth) acrylates, hexanediol di(meth)acrylates, trimethylolpropane tri(acryloyloxypropyl) ether, tri(acryloyloxyethyl) isocyanurate, calcium (meth)acrylates, sodium (meth)acrylates; those obtained by adding ethylene oxide or propylene oxide to a polyhydric alcohol selected from glycerin or trimethylolethane and then reacting the product with (meth)acrylate; urethane acrylates, polyester acrylates; epoxy acrylates obtained by reacting epoxy resins with (meth)acrylic acid; and N-methylol acrylamide derivatives.

13. The presensitized plate of claim 1 further comprising a primer layer on said substrate.

* * * * *